United States Patent [19]

Hui

[11] Patent Number: 5,160,863
[45] Date of Patent: Nov. 3, 1992

[54] DELAY CIRCUIT USING PRIMARILY A TRANSISTOR'S PARASITIC CAPACITANCE

[75] Inventor: Titkwan Hui, Richardson, Tex.

[73] Assignee: Dallas Semiconductor Corporation, Dallas, Tex.

[21] Appl. No.: 374,198

[22] Filed: Jun. 30, 1989

[51] Int. Cl.⁵ .......................... H03K 5/13; H03K 5/14
[52] U.S. Cl. ................................... 307/605; 307/601; 307/603
[58] Field of Search ............... 307/601, 603, 605, 594, 307/362; 357/23.4

[56] References Cited

U.S. PATENT DOCUMENTS

| | | | |
|---|---|---|---|
| 3,387,358 | 6/1968 | Heiman | 357/23.4 |
| 3,600,642 | 8/1971 | Allison | 357/23.4 |
| 3,667,115 | 6/1972 | Barson et al. | 357/23.4 |
| 4,746,823 | 5/1988 | Lee | 307/601 |
| 4,806,804 | 2/1989 | O'Leary | 307/605 |
| 4,812,679 | 3/1989 | Mahabadi | 307/594 |
| 4,812,687 | 3/1989 | Larson et al. | 307/601 |
| 4,837,466 | 6/1989 | Kanauchi | 307/362 |
| 4,879,255 | 11/1989 | Deguchi et al. | 357/43 |
| 4,885,476 | 12/1989 | Mahabadi | 307/594 |
| 4,894,791 | 1/1990 | Jiang et al. | 307/603 |
| 4,899,071 | 2/1990 | Morales | 307/602 |
| 4,903,241 | 2/1990 | Boudewijn | 307/601 |

FOREIGN PATENT DOCUMENTS

| | | | |
|---|---|---|---|
| 0129863 | 10/1980 | Japan | 307/601 |
| 0111429 | 7/1983 | Japan | 307/601 |
| 0226111 | 9/1988 | Japan | 307/603 |
| 133791 | 11/1973 | United Kingdom | 307/594 |

OTHER PUBLICATIONS

Mead et al., "Introduction to VLSI Systems", Oct. 80, pp. 11–14.
Hodges et al., "Analysis and Design of Digital Integrated Circuits", 1983, pp. 52–55.

Primary Examiner—Stanley D. Miller
Assistant Examiner—Terry D. Cunningham
Attorney, Agent, or Firm—Worsham, Forsythe, Sampels & Wooldridge

[57] ABSTRACT

A programmable delay line with digital input to a two-part digital-to-analog converter structure to define an equivalent resistance at a pull-down node. Preferred embodiments are configured as two identical halves. The outputs of the two halves are combined to produce an exactly symmetrical waveform. This is particularly advantageous in a programmable delay line, since this architecture assures that control changes which change the delay will not also introduce asymmetry into the output waveform.

23 Claims, 7 Drawing Sheets

DELAY CIRCUIT USING PRIMARILY A TRANSISTOR'S PARASITIC CAPACITANCE

PARTIAL WAIVER OF COPYRIGHT

All of the material in this patent application is subject to copyright protection under the copyright laws of the United States and of other countries. As of the first effective filing date of the present application, this material is protected as unpublished material. Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

CROSS-REFERENCE TO OTHER APPLICATION

The following application of common assignee contains drawings in common with the present application, and is believed to have an effective filing date identical with that of the present application:

U.S. Ser. No. 07/374,102, filed Jun. 30, 1990, entitled "ARCHITECTURE FOR PROGRAMMABLE DELAY LINE INTEGRATED CIRCUIT" (2846-135); which is hereby incorporated by reference.

BACKGROUND AND SUMMARY OF THE INVENTION

The present invention relates to delay lines, i.e. to integrated circuits which can impose a delay in the transmission of a digital pulse.

Delay lines are often used by system designers to adjust the timing of various events in electronic systems. For example, they may be used to adjust sampling times in high-speed analog systems, or to avoid possible collisions in asynchronous digital systems.

Delay lines commonly provide a capacitor, a source of charging current for the capacitor, a reset switch (to discharges the capacitor), and a thresholding stage. An incoming pulse (whenever one arrives) causes the reset switch to be opened, so that the capacitor begins to charge. The capacitor is charged up until its voltage is high enough to activate the thresholding stage. The output of the thresholding stage provides a digital signal which is propagated through to the output. After the reset switch closes (discharging the capacitor), the delay line is ready for a new cycle.

In this general architecture, the resulting delay will be affected by the capacitor size, by the size of the charging current, and by the trigger voltage of the thresholding gate. If one or more of these factors can be varied, the delay will be adjustable. This is most commonly done by changing the magnitude of the charging current (or sometimes by changing the other parameters listed). The capability to "program" in the delay time is very useful to system designers.

The charging current is usually taken from a current source (having a fixed maximum current $I_{charge}$), so the dependence of the delay is very simple: it is approximately equal to $(C_{int}V_{trip})/T_{charge}$, where $V_{trip}$ is the trigger voltage of the thresholding stage and $C_{int}$ is the value of the capacitor. (Alternatively, if the charging current is limited by a resistor, the charging current will decrease as the voltage on the capacitor increases, so the delays will be slightly less simple to calculate.)

The present invention provides a novel integrated circuit delay line, which includes several features of novelty. These features are particularly advantageous for a high-speed delay lines, e.g. where delays as short as 10 nsec or less may be needed.

In the presently preferred embodiment, the integration capacitor is implemented using a capacitance of relatively small value. (In fact, in the preferred embodiment, this capacitor is implemented using a parasitic capacitance, of which the largest component is the parasitic drain-to-substrate capacitance of the reset transistor.) The use of a small capacitor value has two principal advantages: the delay line can operate at very short delays, and dynamic power consumption is reduced (for a given delay time).

To optimize the characteristics of this parasitic capacitor, the reset transistor is preferably laid out as a circle (more precisely, with a circular lateral boundary between the drain and the channel). This permits the parasitic drain capacitance (which is used as the integration capacitor for timing) to be minimized for a given channel width (or for a given transconductance). Thus, in the mask layout of FIG. 6, it can be seen that the drain is an island which is surrounded by a circular channel. The channel surrounds the drain, and the source region surrounds the channel. (The drain and source regions are shallow n+ diffusions, which are self-aligned to the overlying polysilicon layer.) Diode capacitors have a capacitance/voltage relation which is inherently somewhat nonlinear, but this layout helps to minimize the nonlinearities. (Such nonlinearities tend to be undesirable in a delay line, since they mean that variations in the supply voltage may cause variations in the delay time.)

Another innovative feature disclosed herein is the use of a two-part structure, which partially resembles a DAC (digital-to-analog converter), to define equivalent resistance at a pull-down node. This resistance has a very simple relation to the resulting net delay, and this simple relation provides simple control. (By contrast, if current is used as the controlled variable, the resulting inverse relation will not be as simple to calculate, and therefore will not be as susceptible to control by low-level hardware.)

This structure has several additional advantages. The problem of providing a precisely controlled current is thus decomposed into separate problems of voltage control and resistance control. Both of these problems have been addressed separately, and improvements in both of these areas are continuing to occur. Many circuits have been developed to adjust a reference voltage for temperature variation. By performing such modifications to the reference voltage (instead of using a feedback arrangement to monitor the current), such compensation is simpler. By using a simple resistor circuit for voltage-to-current conversion, current level selection can easily be performed in the resistor structure, with high repeatability. Moreover, existing DAC circuit architectures (or improved DAC architectures which may be introduced in the future) can easily be adapted for use in a programmable delay line (or other circuit) according to the present invention.

In the presently preferred embodiment, temperature compensation is performed in two stages: first, a reference voltage $V_{REF}$ is made to be as nearly temperature-independent as possible (consistent with mass production of an integrated circuit which has a low power budget). In addition, a compensation signal $V_{COMP}$ provides a control signal to the delay line stages, which they can use to compensate for temperature dependence within the delay stage.

A further feature is the use of high-resistivity polysilicon features which have a negative temperature coefficient of resistance. This helps to provide improved temperature compensation, by helping to center the compensation component of the reference voltage. The parallel variation of resistance and voltage helps to maintain a constant current over a broad temperature range.

Another feature is that the delay line is configured using two identical halves. The output of the two halves is combined to produce an exactly symmetrical waveform. This is particularly advantageous in a programmable delay line, since this architecture assures that control changes which change the delay will not change the pulse width of the output waveform.

A further innovative teaching is provided by the alternative embodiment shown in FIG. 7. In this embodiment, the delay cell uses an innovative self-timed precharge cycle. While the capacitor is charging, a parallel (and faster) circuit path brings the output of the thresholding circuit to a predetermined precharge level. This increases the noise margin of the output, and helps to accommodate a wide range of possible delay times.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment, wherein these innovative teachings are advantageously applied to the particular problems of a single-channel delay line, usable for delays of more than 256 nsec (or more than 512 nsec, in an alternative embodiment) down to 10 nsec or less. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
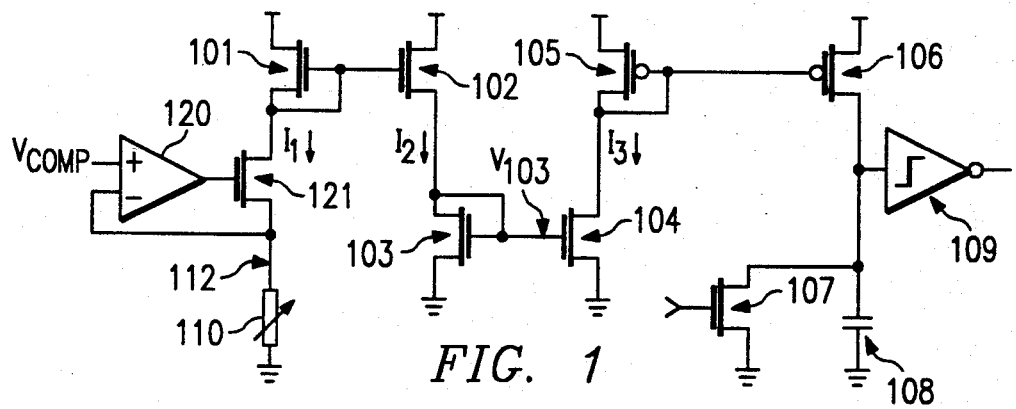
FIG. 1 shows a simplified circuit diagram, which indicates some key portions of the integrated circuit of the presently preferred embodiment.

FIG. 1 shows a simplified circuit diagram, which indicates some key portions of the integrated circuit. A temperature-dependent compensation voltage $V_{COMP}$ is applied to the positive input of an op amp 120, which is connected (using transistor 121) to control the voltage of a node 112 accordingly. (The voltage $V_{COMP}$ can be obtained by a variety of methods familiar in the art of precision analog circuits, and therefore will not be described in detail here. For example, in the presently preferred embodiment this is provided by using a bipolar device together with a feedback to control the current density, as will be described in detail below with reference to FIGS. 8A and 8B.)

A programmable resistor network 110 can be controlled to vary its input resistance $R_{IN}$ between node 112 and ground. Therefore, the current $I_1$ will be determined by this input resistance, and by the voltage of node 112:

$$I_1 = \frac{V_{112}}{R_{110}}.$$

In the steady state, current $I_1$ will pass through PMOS transistor 101, and will therefore be mirrored into PMOS transistor 102. (That is, assuming that other impedances permit, the current $I_2$ will be equal to current $I_1$ multiplied by the ratio of the channel widths of the two transistors, which normally have equal channel length. In the presently preferred embodiment, the two transistors have equal widths and lengths, so that $I_2 = I_1$.) Similarly, current $I_2$ is mirrored through NMOS transistor pair 103/104, and again through PMOS transistor pair 105/106, to provide a current source for charging capacitor 108 in the delay cell 100 made of transistors 104, 105, 106, 107 and capacitor 108.

In an alternative embodiment, the gate voltage $V_{103}$ from transistor 103 can be connected to more than one transistor 104 in more than one cell 100, to provide multiple proportional delays.

Whenever reset transistor 107 is turned on, it discharges the integration capacitor 108. As soon as reset transistor 107 turns off, the current source 106 will begin to charge up the capacitor 108.

When the voltage on capacitor 108 reaches the trip voltage of the thresholding stage 109, stage 109 (that is, the input voltage at which the thresholding stage switches its output) will generate a digital output signal. (The stage 109 may be, for example, a simple inverter, or may be a comparator, or may be another logic gate.) This digital output will be passed through other logic stages to (among other functions) turn on the reset transistor 107, and so discharge capacitor 108 (until a new cycle starts).

Figure 2:
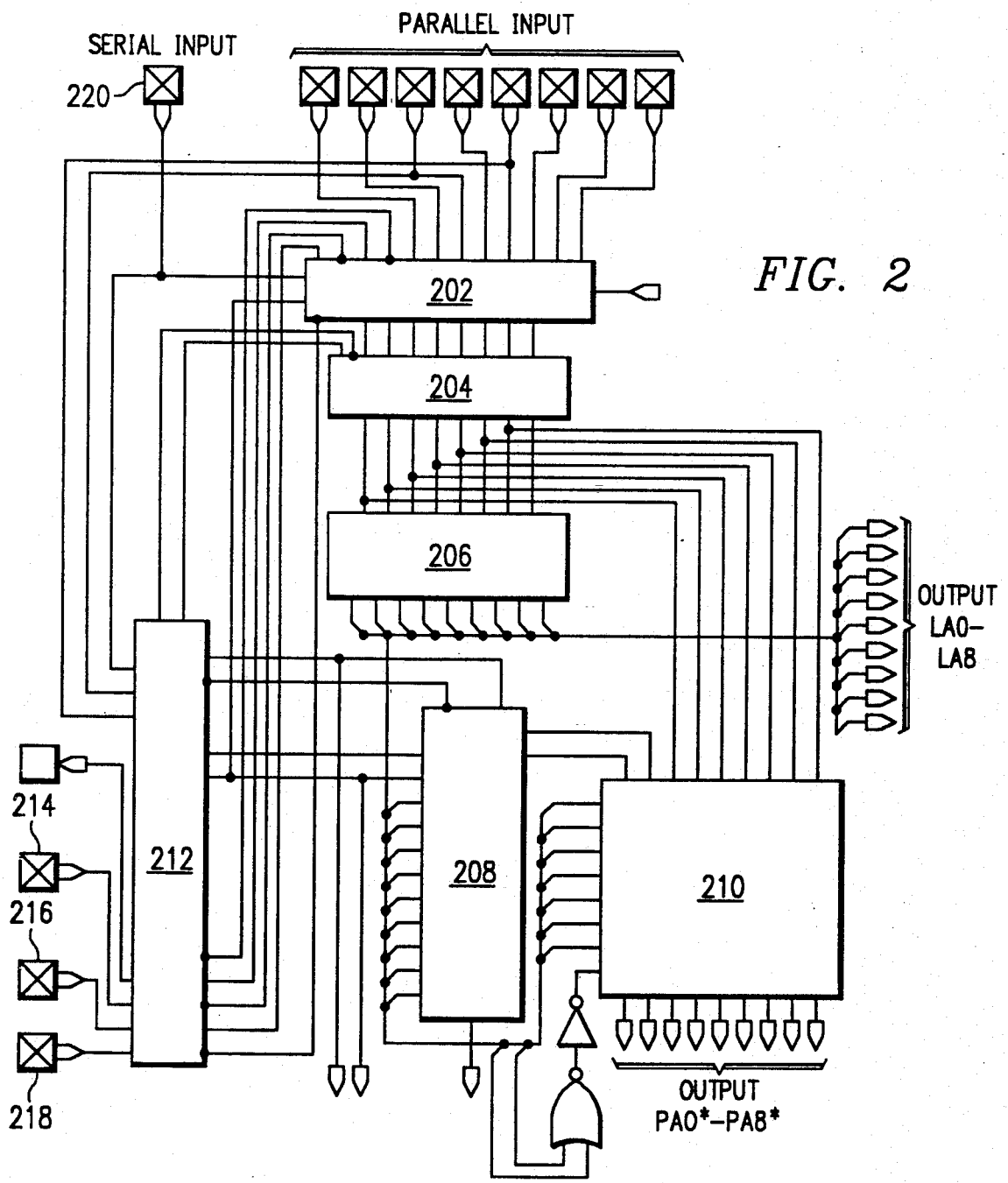
FIG. 2 is a block diagram, showing control and signal relations of the delay line integrated circuit of the presently preferred embodiment.

FIG. 2 is a block diagram, showing the configuration of control logic in the integrated circuit of the presently preferred embodiment. Clock-driver circuitry interfaces to a serial bus, using clock line 214, reset-bar line 216, data line 220, and select line 218. Shift register 202 provides serial/parallel input buffering. Buffer 204, decoder 206, trim control logic 208, and shifter 210 provide the bits PA0*-PA8* and the bits LA0-LA8, which control the variable resistance 110.

Figure 3:
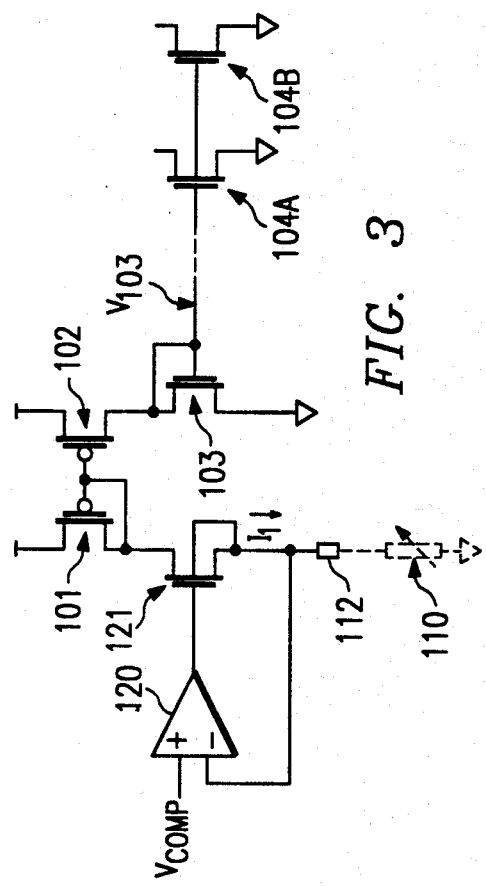
FIG. 3 schematically shows circuitry portions which perform the voltage-to-current conversion, in the presently preferred embodiment.

FIG. 3 shows greater detail of the circuit elements which perform the voltage-to-current conversion in that multiple delay cells are indicated by the n-channel FETs 104A and 104B which receive the output of the circuit. Note that transistor 121 preferably has nominal channel dimensions of 300 microns wide, and only 1.5 microns long (this is written as "300/1.5"). Transistor 101 is configured as ten devices in parallel, each having a channel width of 30 microns and a channel length of 10 microns (which is written as "10×30/10"). Transistor 102 is also 10×30/10, and transistor 103 is 5×30/25.

Figure 4:
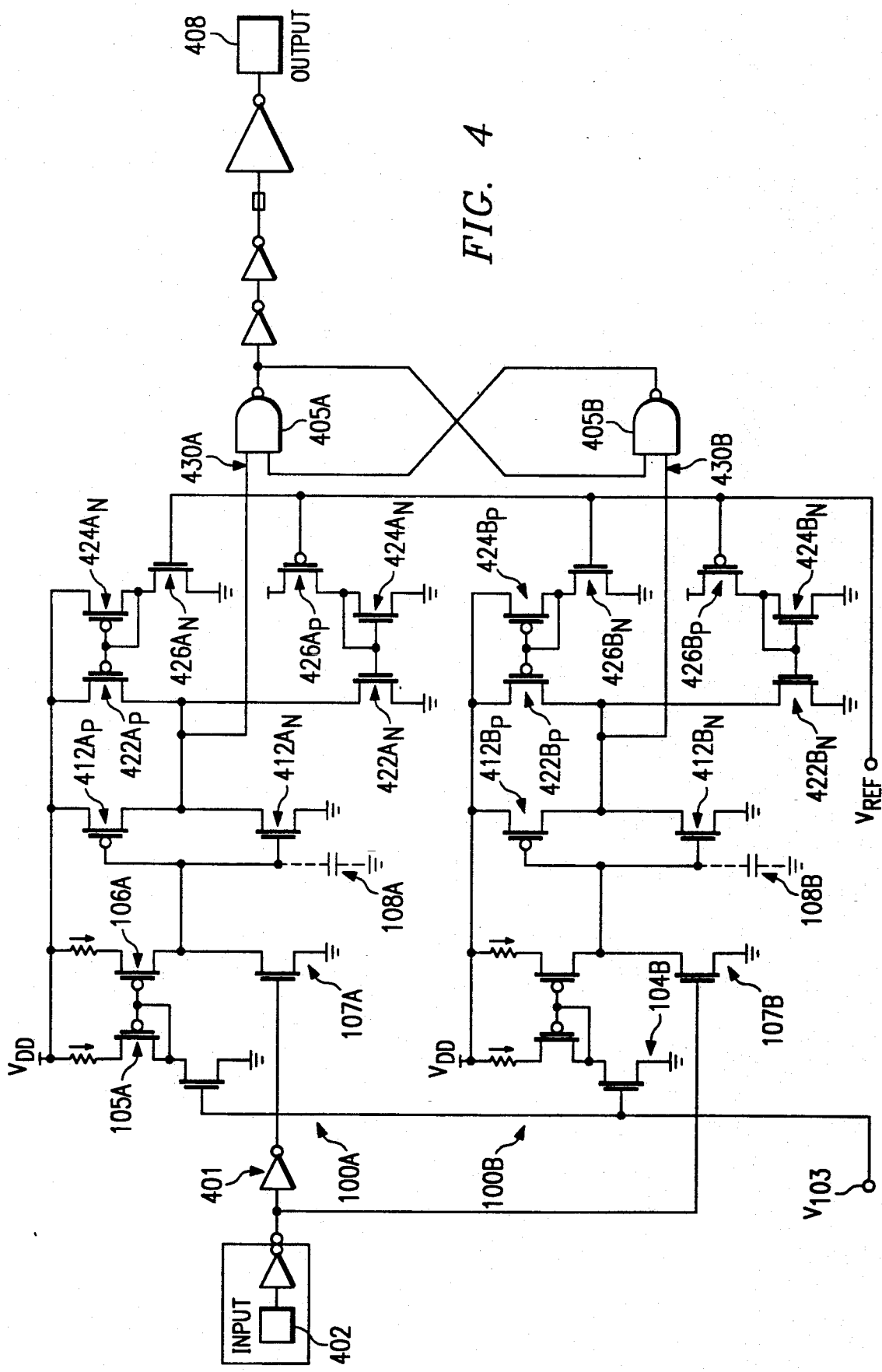
FIG. 4 shows the delay cell used in the presently preferred embodiment.

FIG. 4 shows the delay cell used in the presently preferred embodiment.

The incoming signal is inverted, at inverter 401, to provide complementary signals to a pair of identical delay cells (shown as 100B and 100A respectively).

In each of these cells 100, a control voltage $V_{103}$ is mirrored to control a current source transistor 106. This transistor provides the charging current which is integrated on the parasitic integration capacitor 108. (As discussed above, the largest contribution to this parasitic capacitor is made by the drain junction of the large reset transistor 107. The specific structure of transistor 107 is described in great detail below.)

The voltage on the integration capacitor 108 is connected to control a following inverter 412 (which, in the presently preferred embodiment, is a full-CMOS buffer). A control voltage $V_{REF}$ is mirrored, through transistors $424_P$, $424_N$, $426_N$, $426_P$, $422_P$, and $422_N$, to set the threshold voltage of the inverter stage 412.

The outputs of these delay cells are combined using cross-coupled NAND gates 405, to provide a single digital output which is buffered and used to drive output stages. (The NAND gates 405, in the presently preferred embodiment, each have 40 micron wide PMOS input devices and 20 micron wide NMOS input devices.)

The operation of the cell 100 will now be described in detail.

1) Initially, suppose that the input voltage has been high for a long time.

1.a) In cell 100A, reset transistor 107A is off, so that current source transistor 106A will have charged up capacitor 108A, and NMOS device 412A will be on. The direct input to NAND gate 405A is therefore low, and the output of NAND 405A is high. Therefore, the output voltage will also be high.

1.b) In cell 100B, reset transistor 107B is on, so that both plates of capacitor 108B are at ground. NMOS device 412B will therefore be off. The direct input to NAND gate 405B will therefore be high (as will the other input, which is cross-coupled from the output of NAND gate 405A), so the output of NAND $405B_P$ will be low.

2) Now suppose that the input voltage (on pad 402) goes low. Reset transistor 107A will turn on, and reset transistor 107B will turn off.

2.a) Transistor 412B is still off (but it will turn on as soon as the voltage on capacitor 108B has risen to $V_{TN}$). Transistor $422B_P$ continues to conduct current (at a rate controlled by voltage $V_{REF}$), so that the direct input to NAND gate 405B remains high.

2.b) Reset transistor 107A rapidly discharges capacitor 108A, so that transistor $412A_N$ turns off within a nanosecond or so. The current from $422A_P$ will pull up the direct input to NAND gate 405A. However, since NAND gate 405B has not changed its output state, the cross-coupled input to NAND gate 405A remains low, and the signal at output pad 408 does not change yet.

3) After a predetermined further time interval (e.g. 10-300 nanoseconds, depending on the voltage $V_{103}$), the capacitor 108B will have been charged up to $V_{TN}$). When this happens, transistor $412B_N$ begins to turn on, and rapidly drives node 430B low. NAND gate 405B now switches its output high, so that NAND gate 405A now sees two high inputs, and a low level appears at the output. (A large output driver, not shown, is used, in the presently preferred embodiment, following the stages shown.)

4) When the input signal goes low again, an analogous sequence of events will be repeated. However, this time the principal element of delay will be the time required to charge up capacitor 108A to the point where transistor $412A_N$ turns on strongly enough to pull node 430A low. Thus, the rising and falling edges of the incoming pulse have been delayed by equal amounts. The pulse at the output will therefore have the same width as the input pulse.

Figure 5:
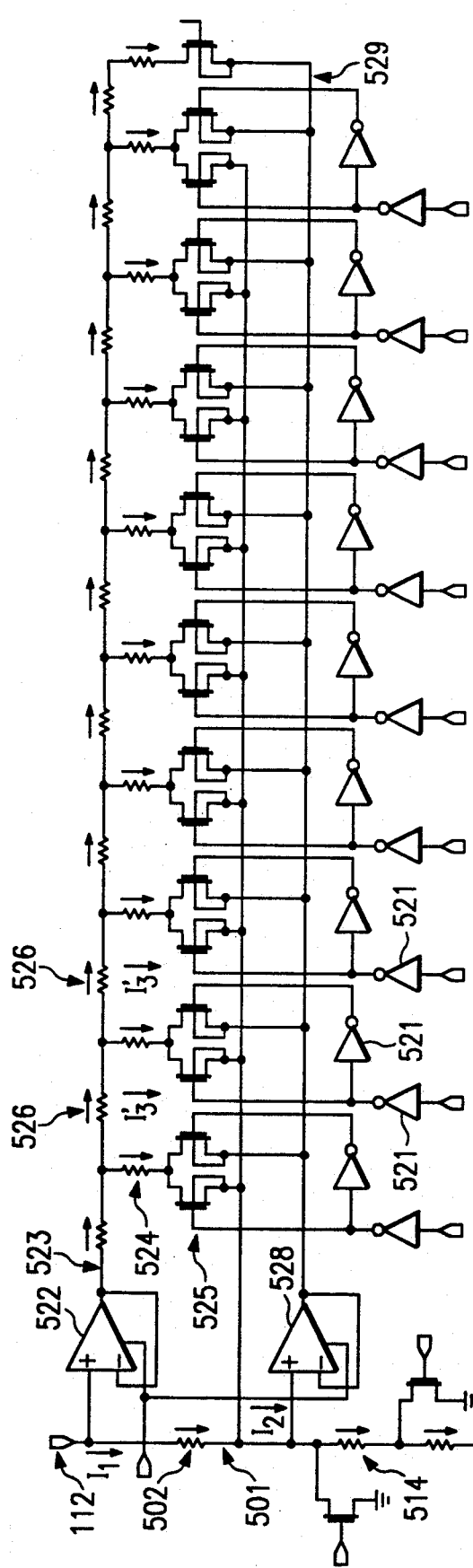
FIG. 5 shows the architecture used, in the presently preferred embodiment, to provide a programmable resistance.

FIG. 5 shows the architecture used, in the presently preferred embodiment, to provide the programmable resistance 110. Note that the architecture shown includes both a linear resistor string 510 including the eight resistors 514 in series between node 501 and ground and an R/2R array 520 which includes the horizontal array of resistors 524 and resistors 526 with each resistor 524 having twice the resistance of each resistor 526.

Node 112, as described above, is held to a fixed voltage. The structure shown in FIG. 5 is controllable to vary the resistance from this node to ground. This permits the magnitude of the current component $I_1$ to be controlled.

The current component $I_1$ flows through resistor 502, and also through the resistor string 510, from node 501 to ground. The resistor string 510 carries not only current component $I_1$, but also another current component $I_3$. The current component $I_3$ is variable, so that $I_1$ can also be varied by varying $I_3$.

That is, the current component $I_1$ is equal to $$I_1 = \frac{V_{112} - I_3 R_{510}}{R_{502} + R_{510}}.$$

where $R_{510}$ is the resistance of the series string of resistors 510 taking into account the short to ground by any of the transistors 512 that is turned on. Thus the foregoing equation is simply Ohm's law for the voltage drop from node 112 to ground equaling the drop across resistor 502 ($I_1 R_{502}$) plus the drop across resistor string 510 (($I_1 + I_3)R_{510}$). By selecting one of the control lines LA0-LA6 (that is, applying a high signal to one of the lines LA0-LA6 that connect the output of decoder 206 of FIG. 2 to the gates of transistors 512 which provide current paths bypassing various resistors in the string 510) the value of $R_{510}$ can be adjusted (down to zero if desired). Moreover, the R/2R array 520 permits current component $I_3$ to be controlled as well (in accordance with the state of bits PA0*-PA8*, which are the output of shifter 210 of FIG. 2). That is, each of the bits PA0* through PA8* can steer a respective current component $I_3'$ either to node 501 or to node 529. (Op amp 528 holds node 529 at the same potential as node 501, and therefore the voltage seen by each of the resistors 524 is independent of the state of bits PA0*-PA8*.) The sum of the current components $I_3'$ provides the net current contribution $I_3$, which changes the voltage of node 501 as discussed above.

The resistor string 510 sets the resistance from node 501 to ground. This resistance is selected by driving one of the control bits LA0-LA6. Each of these control bits is connected to a respective transistor 512, which will ground the node above one of the resistors 514 if the corresponding bit is driven high. (As noted above, only one of these bits would normally be driven high.) The resistors 514, in the presently preferred embodiment, have resistance values that increase along the string from node 501 to ground: the resistor $514_{LA0}$ (i.e. the resistor which connects to node 501, and which would be bypassed if transistor $512_{LA0}$, controlled by bit LA0, is turned on) has a value of about 4 Kilohms, in the presently preferred embodiment. Resistor $514_{LA1}$ (that is, the resistor which connects to resistor $514_{LA0}$ and would be bypassed if transistor $512_{LA1}$ controlled by bit LA1 were turned on) is also about 4 Kilohms, but the other resistors progressively double in length (and therefore in resistance value), so that resistor $514_{LA6}$ has a value of about 256 Kilohms (and therefore has 32 times the resistance of $514_{LA1}$). The transistors 512 are also preferably scaled in powers of two, so that transistor $512_{LA1}$ has approximately 32 times the drive capability of transistor $512_{LA6}$.

The operation of the R/2R array 520 will now be described.

Op amp 522 provides a current source at node 523 (and holds this node to approximately the same voltage as node 112). Similarly, op amp 528 provides a current sink at node 529, and holds this node to approximately the same voltage as node 501.

Each stage of the R/2R array 520 receives a current component, sourced by op amp 522, which is passed through that stage's resistor 524, and also through the series resistors 526 of the previous stages (if any). Each stage includes a pair of switching transistors 525, which receive complementary control signals (through inverters 521) to switch the current component of that stage into one of two nodes of equal voltage: node 501 or node 529.

The currents flowing to node 529 are sinked by op amp 528, and do not affect the current $I_1$. However, the currents which are switched into node 501 flow through the resistor string 510, and therefore change the voltage of node 501, and therefore change the magnitude of current $I_1$.

Since the different stages of R/2R array 520 receive different amounts of current, the device sizes of the switches 525 are preferably of different sizes in accordance with the current to possibly be handled. The first two stages use 256 micron wide (minimum length) NMOS devices, and the device sizes are scaled in powers of two down to the eighth stage, which has a 4 micron channel width. The ninth stage uses a 4 micron wide device with double the minimum length, and the tenth stage uses a device with four times the minimum length.

The resistors 514, 526, and 524, in the presently preferred embodiment, are made of high-resistivity polysilicon, having a sheet resistance of about 300-325 ohms per square, and doped with arsenic to achieve a negative temperature coefficient of resistance. These resistors are preferably all patterned to have a linewidth of about 7 microns, in the presently preferred embodiment.

Figure 6:
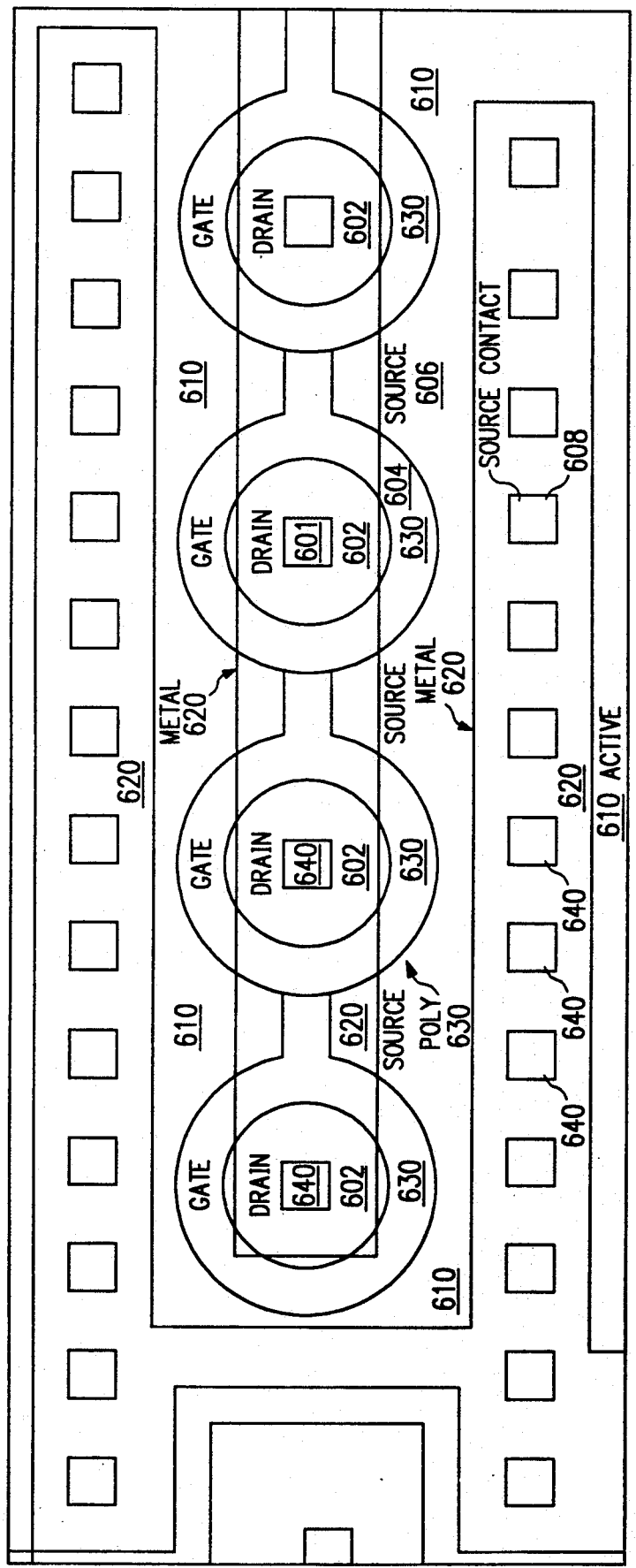
FIG. 6 shows the layout preferably used to provide the pull-down transistor in the delay cell of FIG. 4.

FIG. 6 shows the layout preferably used to provide the reset transistor 107 in the delay cell of FIG. 4. This Figure shows the poly, metal, and contact layers, which define key spatial relations of this transistor. The whole area shown is part of an active (moat) area 610, so that the POLY layer 630 forms a transistor gate (or at least an MOS capacitor to substrate) everywhere in the area shown. The active area was originally p-type, but a self-aligned source/drain implant will cause the active area 610 to be heavily n+ doped (to a shallow depth, e.g. 0.25 microns) wherever it is not covered by the POLY layer 630. (The POLY layer 630 is preferably polysilicon, but alternatively may be silicide, or a polysilicon/silicon layer structure, or other conductive composition.) Metal layer 620 makes contact to the active area 610 wherever a contact 640 is located.

Thus, each of the circular portions of the POLY layer 630 defines a p-type channel region thereunder, which separates an n+ region within the ring from another n+ region outside the ring. The n+ portion within the ring is connected, in the presently preferred embodiment, through drain contacts 601 to provide the drain region 602 of reset transistor 107. Source contacts 608 connect the n+ region 606 to provide the source of transistor 107. The circular portions of the polysilicon layer 630 act as gate regions 604, which control this transistor. (The structure shown, with four circular gates connected together, actually provides four transistor channels which are connected together in parallel.)

This structure provides a transistor which has high drive current capability, but also has a relatively low parasitic capacitance at the drain terminal. The circular shape of the drain diffusion (from a top view, as shown) helps to minimize geometry-dependent field enhancements. Moreover, the circular boundary of the drain means that the ratio of effective channel width to drain junction area is very large, and this helps to minimize drain parasitic capacitance, as desired.

Note that, although the drain capacitance $C_{para/Drain}$ is extraordinarily low (in relation to the drive capability of this transistor), the source capacitance $C_{para/source}$ will be fairly large, so that the total capacitance of the structure ($C_{para/Source} + C_{para/Drain} + C_{para/Interconnect}$) is not necessarily lower than comparable MOS devices. (In the device used in the preferred embodiment, the source is tied to ground, which is also the potential of the P-well in which this transistor is located, so that the parasitic source capacitance is irrelevant to the circuit operation.)

The gate delay of an MOS circuit stage will be at least partially dependent on the time constant $R_{series}C_{load}$, where $R_{series} = R_{Interconnect} + R_{Contact} + R_{Channel} + R_{Source/Drain}$, and $C_{load} = C_{Gate} + C_{para/Source} + C_{para/Drain} + C_{para/Interconnect}$. Thus, it has been recognized that the speed of devices can be improved by reducing the parasitic capacitance ($C_{para/Source} + C_{para/Drain}$) and/or by reducing the parasitic capacitance $C_{para/Interconnect}$. By contrast, the disclosed innovative structure is not primarily directed to reducing ($C_{para/Source} + C_{para/Drain}$): instead, this structure is primarily aimed at reducing $C_{para/Drain}$, regardless of the value of $C_{para/Source}$. This approach, and the resulting structure, are believed to be significantly different from that which would be motivated by concerns of speed enhancement.

Generation of Reference Voltages $V_{REF}$ and $V_{COMP}$

Figure 8A:
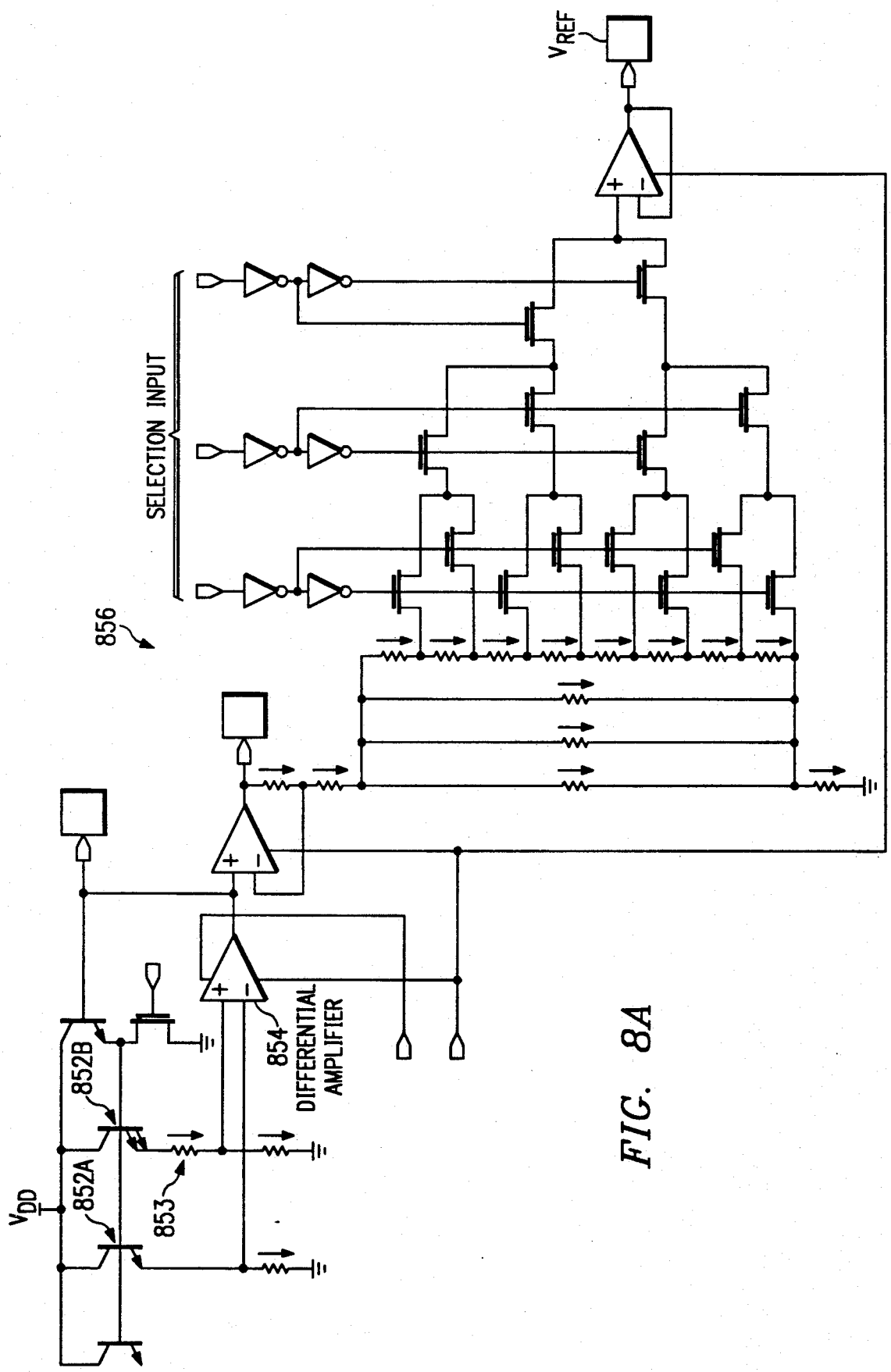
FIG. 8A shows the circuit used, in the preferred embodiment, to generate the compensating voltage $V_{COMP}$.

FIG. 8A shows the circuit used, in the preferred embodiment, to generate the temperature-independent reference voltage $V_{REF}$. Bipolar devices 852A and 852B are identical, except that device 852B has a resistor 853 in series with its emitter, and the two provide inputs to differential amplifier 854. The resulting signal is scaled, by programmable voltage divider network 856, which has an eight resistor string (vertical in FIG. 8A) with taps between the resistors, one tap is connected to the output opamp (this tap is selected by the three bit pattern applied to the transistor gates) to provide the output signal $V_{REF}$.

Figure 8B:
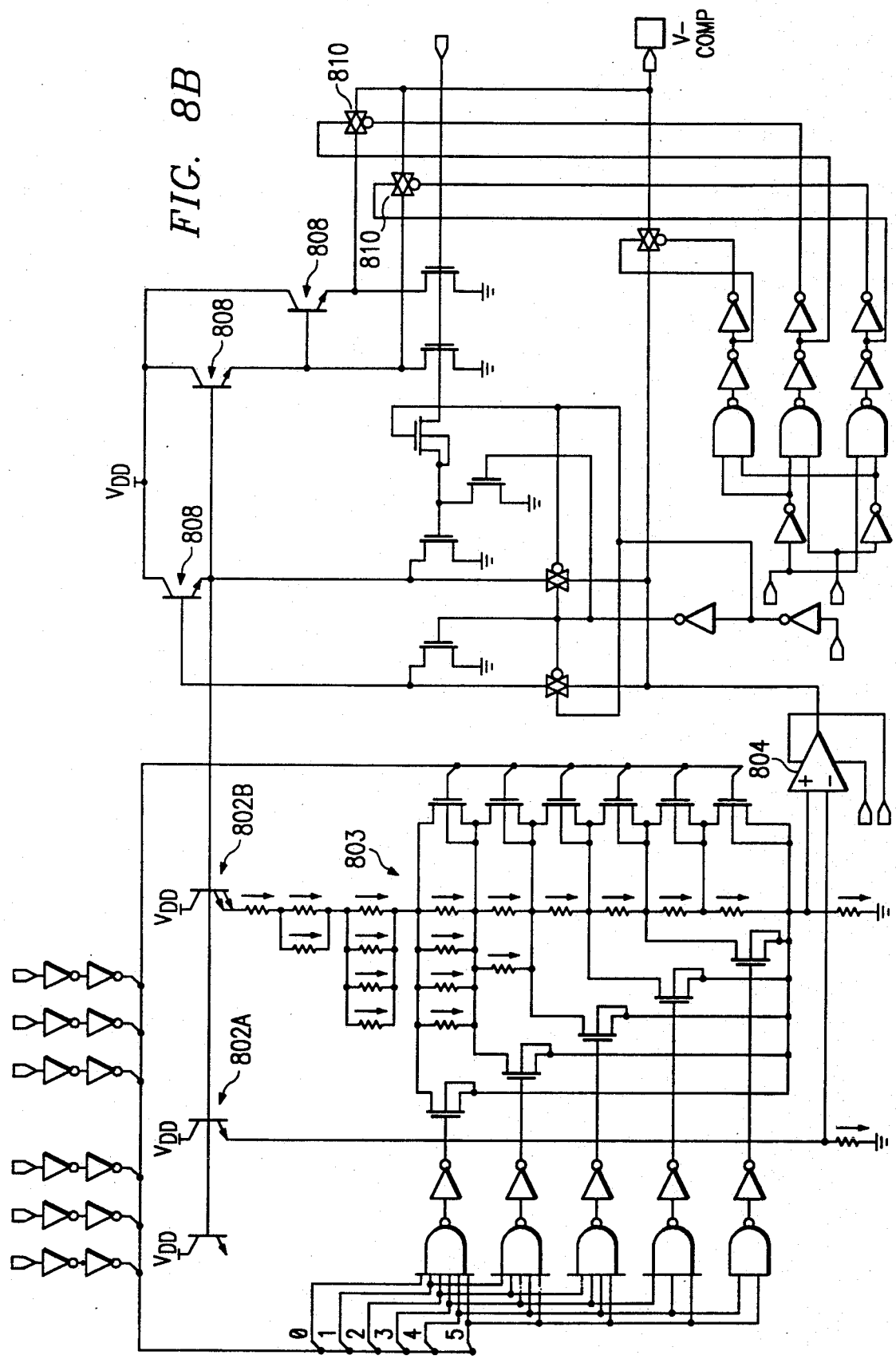
FIG. 8B shows the circuit used, in the preferred embodiment, to generate the temperature-independent reference voltage $V_{REF}$.

FIG. 8B shows the circuit used, in the preferred embodiment, to generate the compensating voltage $V_{COMP}$, which controls the threshold voltage of the digital gate in each of the delay lines 100A and 100B. Bipolar devices 802A and 802B are identical, except that device 802B has a (programmable) resistor 803 in series with its emitter, and the two provide inputs to differential amplifier 804. The additional circuitry shown also permits the effective temperature coefficient to be switched from positive to negative. Additional bipolar devices 808 provide further reduced voltages, which can be selected for output by control signals applied to one of the pass gates 810. The output of this circuit is a signal $V_{COMP}$, which is amplified, with a variable gain, by subsequent circuit stages, for trimming and to compensate for any amplitude variations caused by the control signals applied to the variable resistor 803.

Alternative Embodiment with Precharge Path

One alternative embodiment uses an innovative self-timed precharge cycle. While the capacitor is charging, a parallel (and faster) circuit path brings the output of the thresholding circuit to a predetermined precharge level. This increases the noise margin of the output, and helps to accommodate a wide range of possible delay times.

Figure 7:
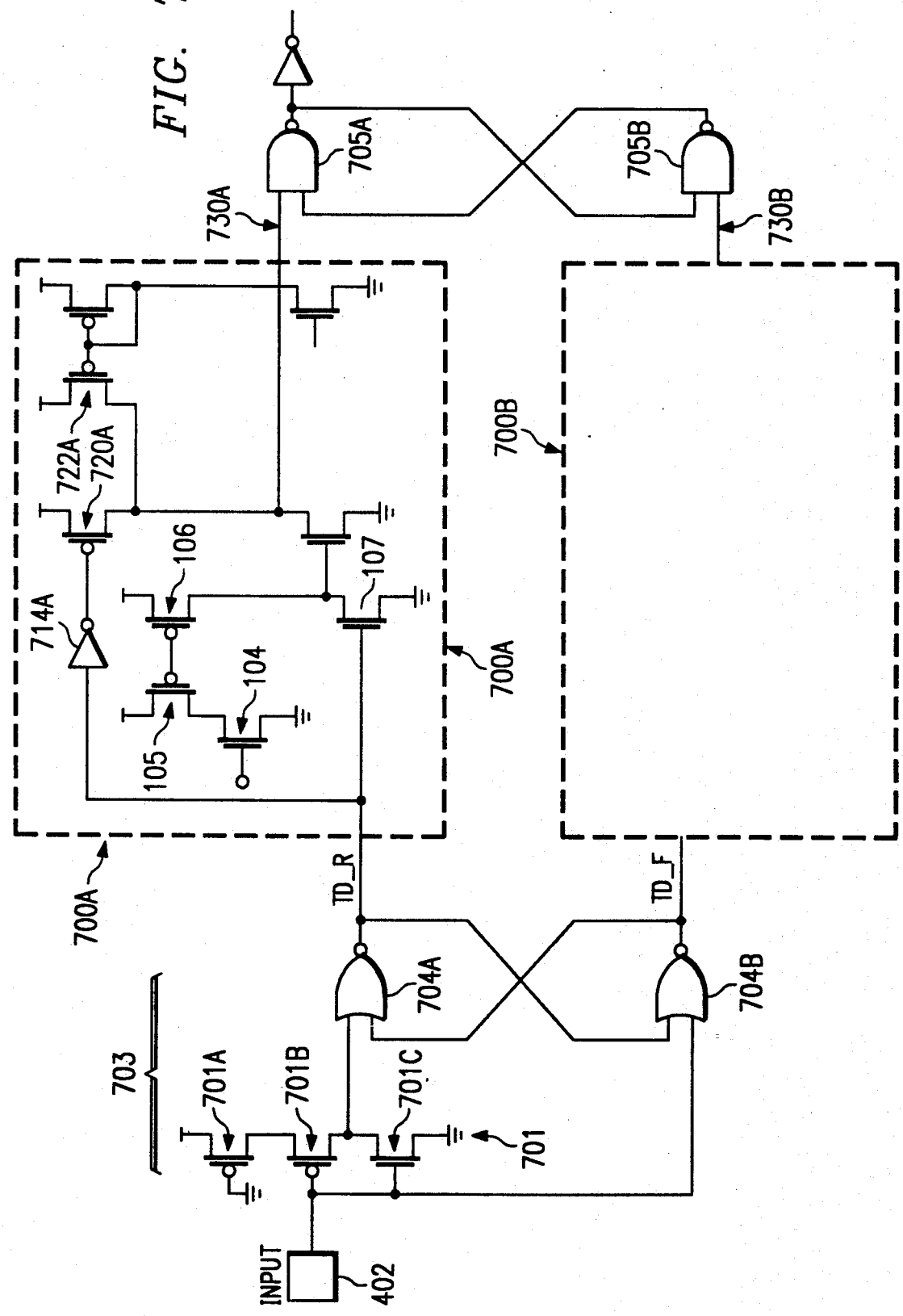
FIG. 7 shows an alternative version of the delay cell of FIG. 4, incorporating a precharge path.

FIG. 7 shows an alternative delay cell, which includes a precharge path not used in the circuit of FIG. 4, and also differs from the circuit of FIG. 4 in other respects.

The input buffer 703 includes a pair of cross-coupled NOR gates 704, and an inverter 701 which inverts the signal to the NOR gate 704A shown uppermost. This inverter includes a 100/1.5 NMOS pull-down device 701C, a 20/1.5 PMOS pull-up device 701B, and a grounded-gate PMOS series load 701A, which helps to reduce switching transients generated by inverter 701.

The device dimensions of each of the NOR gates 704, in this embodiment, are asymmetrical. The signal input is connected to a 125 micron wide NMOS device and a 25 micron wide PMOS device (minimum length). However, the other input to each NOR gate (i.e. the cross-connection from the other NOR gate's output) is connected to a 65 micron wide PMOS pull-up and a 30 micron wide NMOS pull-down.

Thus, the input buffer 703 provides complementary signals TD_R, which goes high when a rising edge occurs at input pad 402, and TD_F (the output of NOR gate 704B), which goes high when a falling edge occurs at input pad 402. These signals propagate through a pair of identical delay cells (shown as 700B and 700A respectively).

The outputs of these delay cells are combined using cross-coupled NAND gates 705, to provide a single digital output which is buffered and used to drive output pad 408.

The cell 700, unlike cell 100, contains a precharge path, which will now be described in the context of the operation of the cell 700. Since the two delay cells 700A and 700B are internally identical, only 700A is shown in detail in FIG. 7.

1) Initially, suppose that the input voltage (at pad 402) has been low for a long time. PMOS device 701B is on, line TD_R is low, and line TD_F is high.

1.a) In cell 700A, reset transistor 107A is off, so that current source 7106B will have charged up capacitor 108A, and NMOS device 712A will be on. The direct input to NAND gate 705A is therefore low, and the output of NAND 705A is high. Therefore, the voltage at output pad 408 will also be high. Note also that inverter 714A, in this condition, sees a low input, and therefore PMOS device 720A is turned off.

1.b) In cell 700B, reset transistor 107B is on, so that both plates of capacitor 108B are at ground. NMOS device 712B will therefore be off. The direct input to NAND gate 705B will therefore be high (as will the other input, which is cross-coupled from the output of NAND gate 705A), so the output of NAND 705B will be low. Note also that inverter 714B, in this condition, sees a high input, and therefore PMOS device 720A is on.

2) Now suppose that the rising edge of a pulse appears at input pad 402. As the voltage at this pad rises above $V_{TN}$, NMOS transistor 701C will begin to turn on. Since a 100 micron NMOS transistor is much stronger than a 20 micron PMOS transistor, the direct input to NOR gate 704A will rapidly go low, even though transistor 701B is still conducting current. (Transistor 701C will limit the "crowbar" current which occurs during this brief time.) Similarly, in the other NOR gate 704B, the 125 micron pull-down will begin to turn on, and will rapidly pull the output TD_F low. Thus, both of the inputs to NOR gate 704A are now going low, so NOR gate 704A drives its output TD_R high.

2.a) This falling edge on line TD_F has two effects: reset transistor 107B and transistor 720B are both turned off. Transistor 712B is still off (but it will turn on as soon as the voltage on capacitor 108B has risen to $V_{TN}$). Transistor 722B continues to conduct current (at a rate controlled by voltage $V_{COMP}$), so that the direct input to NAND gate 705B remains high.

2.b) At the same time, the rising edge on line TD_R causes transistors 107A and 720A to turn on. Reset transistor 107A rapidly discharges capacitor 108A, so that transistor 712A turns off within a nanosecond or so. The current from 722A will pull up the direct input to NAND gate 705A. However, since NAND gate 705B has not changed its output state, the cross-coupled input to NAND gate 705A remains low, and the signal at output pad 408 does not change yet.

3) After a predetermined further time interval (e.g. 10-300 nanoseconds, depending on the voltage $V_{103}$), the capacitor 108B will have been charged up to $V_{TN}$. When this happens, transistor 712B begins to turn on, and rapidly drives node 730B low. NAND gate 705B now switches its output 731B high, so that NAND gate 705A now sees two high inputs. The low state of output 731A causes a high level to appear at output pad 408.

4) When the signal at the input pad 402 goes low again, an analogous sequence of events will be repeated. However, this time the principal element of delay will be the time required to charge up capacitor 108A to the point where transistor 712A turns on strongly enough to pull node 730A low. Thus, the rising and falling edges of the incoming pulse have been delayed by equal amounts. The pulse at the output 408 will therefore have the same width as the input pulse.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly their scope is not limited except by the allowed claims.

What is claimed is:

1. An integrated circuit delay line, comprising:
   an integration capacitance;
   a current source, connected to charge said capacitance;
   a reset device, connected to discharge said capacitance when said reset device is turned on; and
   a threshold circuit, coupled to said capacitance to provide a digital output signal whenever said capacitance has charged up to a predetermined voltage;
   wherein said reset device includes a field effect transistor which is shaped so that a channel region thereof laterally surrounds a first source/drain region thereof,
   and wherein said capacitance consists primarily of a parasitic junction capacitance seen at said first source/drain region of said transistor.

2. The integrated circuit of claim 1, wherein said threshold circuit is an inverter.

3. The integrated circuit of claim 1, wherein said threshold circuit is an CMOS inverter.

4. The integrated circuit of claim 1, wherein said current source is a field-effect transistor having a gate connected to be driven by a current mirror circuit.

5. The integrated circuit of claim 1, wherein said current source is a P-channel insulated-gate field-effect transistor having a gate connected to be driven by a current mirror circuit.

6. The integrated circuit of claim 1, wherein said threshold circuit is a comparator.

7. The integrated circuit of claim 1, wherein said field-effect transistor has an approximately circular lateral boundary between said first source/drain region thereof and said respective channel region thereof.

8. The integrated circuit of claim 1, wherein said field-effect transistor is an N-channel insulated-gate field-effect transistor.

9. The integrated circuit of claim 1, wherein said field-effect transistor is an N-channel insulated-gate field-effect transistor, and wherein said channel region of said field-effect transistor directly overlies a semiconductor body which is held at approximately ground potential, and wherein said channel region of said field-effect transistor is laterally surrounded by a second source/drain region which is held at approximately ground potential.

10. The integrated circuit of claim 1, wherein said field-effect transistor is an N-channel insulated-gate field-effect transistor, and wherein said channel region of said field-effect transistor directly overlies a semiconductor body which is held at approximately ground potential.

11. The integrated circuit of claim 1, wherein said channel region of said field-effect transistor is laterally surrounded by a second source/drain region which is held at approximately ground potential.

12. The integrated circuit of claim 1, wherein said reset device is configured as multiple field-effect transistors in parallel, and multiple ones of said field-effect transistors each have an approximately circular lateral boundary between said respective first source/drain region thereof and said respective channel region thereof.

13. The integrated circuit of claim 1, wherein said reset device is configured as multiple field-effect transistors in parallel, and multiple ones of said field-effect transistors each have an approximately circular lateral boundary between said respective first source/drain region thereof and said respective channel region thereof, and a second diffusion, having the same conductivity type as said first source/drain diffusion, laterally abuts said respective channel regions of multiple ones of said transistors to form a common second source/drain region for each of said transistors.

14. The integrated circuit of claim 1, wherein said reset device is configured as multiple field-effect transistors in parallel, and multiple ones of said field-effect transistors each have an approximately circular lateral boundary between said respective first source/drain region thereof and said respective channel region thereof.

15. An integrated circuit delay line, comprising:
   first and second integration capacitances;
   first and second current sources, each connected to charge a respective one of said capacitances;
   first and second reset devices, each including a transistor and connected to, when turned on, discharge a respective one of said capacitances; and
   first and second threshold circuits, each connected to provide a digital signal whenever a respective one of said capacitances has charged up to a predetermined voltage;
   an input edge detector, operatively connected to turn off said first reset device when a rising edge of an incoming digital signal occurs, and to turn off said second reset device when a falling edge of an incoming digital signal occurs; and output logic, connected to receive said respective digital signals from said first and second threshold circuits, and to logically combine said respective digital signals to provide an output signal.

16. The integrated circuit of claim 15, wherein said threshold circuit is an CMOS inverter.

17. The integrated circuit of claim 15, wherein said current source is a field-effect transistor having a gate connected to be driven by a current mirror circuit.

18. The integrated circuit of claim 15, wherein said threshold circuit is a comparator.

19. The integrated circuit of claim 15, wherein said transistor is a field-effect transistor which has an approximately circular lateral boundary between said first source/drain region thereof and said respective channel region thereof.

20. The integrated circuit of claim 15, wherein said transistor is an N-channel insulated-gate field-effect transistor, and wherein channel region of said transistor directly overlies a semiconductor body which is held at approximately ground potential, and wherein said channel region of said transistor is laterally surrounded by a second source/drain region which is held at approximately ground potential.

21. The integrated circuit of claim 15, wherein said channel region of said transistor is laterally surrounded by a second source/drain region which is held at approximately ground potential.

22. The integrated circuit of claim 15, wherein said reset device is configured as multiple field-effect transistors in parallel, and multiple ones of said field-effect transistors each have an approximately circular lateral boundary between said respective first source/drain region thereof and said respective channel region thereof.

23. An integrated circuit delay line, comprising:
a silicon substrate;
an integration capacitance;
a current source, connected to charge said capacitance;
a reset device, including a transistor formed at a surface of said substrate, connected to discharge said capacitance when said reset device is turned on; and
a threshold circuit, connected to provide a digital output signal whenever said capacitance has charged up to a predetermined voltage;
wherein said transistor is a field-effect transistor which is shaped so that a channel region thereof laterally surrounds a first source/drain region thereof,
and wherein said integration capacitance consists essentially of the parasitic capacitance to substrate seen at said first source/drain region of said transistor.

* * * * *